(12) United States Patent
Watanabe

(10) Patent No.: US 8,952,607 B2
(45) Date of Patent: Feb. 10, 2015

(54) LIGHT EMITTING MODULE AND LIGHTING DEVICE

(71) Applicant: Toshiba Lighting & Technology Corporation, Yokosuka-shi, Kanagawa-ken (JP)

(72) Inventor: Miho Watanabe, Yokosuka (JP)

(73) Assignee: Toshiba Lighting & Technology Corporation, Yokosuka-shi, Kanagawa-ken (JP)

( * ) Notice: Subject to any disclaimer, the term of this patent is extended or adjusted under 35 U.S.C. 154(b) by 0 days.

(21) Appl. No.: 14/031,554

(22) Filed: Sep. 19, 2013

(65) Prior Publication Data

US 2014/0232257 A1 Aug. 21, 2014

(30) Foreign Application Priority Data

Feb. 21, 2013 (JP) ................................. 2013-032644

(51) Int. Cl.
*H05B 33/12* (2006.01)
*H01L 33/50* (2010.01)

(52) U.S. Cl.
CPC .............. *H05B 33/12* (2013.01); *H01L 33/504* (2013.01); *H01L 33/501* (2013.01)
USPC ............................ 313/503; 313/498; 313/512

(58) Field of Classification Search
USPC ...................... 313/498–512, 110–112; 257/98
See application file for complete search history.

(56) References Cited

U.S. PATENT DOCUMENTS

| 7,497,973 B2 | 3/2009 | Radkov et al. |
| 8,847,264 B2* | 9/2014 | Ishiwata et al. ................. 257/98 |
| 2006/0169998 A1 | 8/2006 | Radkov et al. |
| 2014/0231847 A1* | 8/2014 | Watanabe et al. ............... 257/98 |
| 2014/0264418 A1* | 9/2014 | Murphy et al. ................. 257/98 |
| 2014/0268655 A1* | 9/2014 | Murphy et al. .............. 362/97.1 |

FOREIGN PATENT DOCUMENTS

JP 2009-528429 A 8/2009

* cited by examiner

*Primary Examiner* — Tracie Y Green
(74) *Attorney, Agent, or Firm* — Banner & Witcoff, Ltd.

(57) ABSTRACT

A light emitting module according to one embodiment includes a substrate; a light emitting body disposed on the substrate; and a phosphor layer having a first phosphor and a second phosphor which are excited by emitted light of the light emitting body. The first phosphor has a light emitting peak whose half-value width is 20 nm or less in a wavelength range from 610 nm to less than 650 nm, and the second phosphor has the light emitting peak in the wavelength range between a peak wavelength of a light emitting spectrum of the light emitting body and the peak wavelength of the light emitting spectrum of the first phosphor. Then, a distribution of the first phosphor in the phosphor layer has density gradient, where the density of the first phosphor increases toward at least one end of the phosphor layer in a direction perpendicular to the substrate.

15 Claims, 4 Drawing Sheets

LIGHT EMITTING MODULE AND LIGHTING DEVICE

CROSS-REFERENCE TO RELATED APPLICATIONS

This application is based upon and claims the benefit of priority from Japanese Patent Application No. 2013-032644, filed on Feb. 21, 2013; the entire contents of which are incorporated herein by reference.

FIELD

Embodiments described herein relate generally to a light emitting module and a lighting device.

BACKGROUND

Most light emitting modules used as a light source of lighting equipment include a blue light emitting element and a phosphor which is excited by emitted light from the blue light emitting element, and output white light obtained by combining blue light emitted from the blue light emitting element and longer wavelength light emitted from the phosphor. Then, for the phosphor converting the blue light into the long wavelength light, it is desirable to use a phosphor which has a high luminous efficiency and exhibits less decrease of luminous flux as increasing ambient temperature. For example, in view of such characteristics, a YAG phosphor emitting yellow light and a CASN phosphor emitting red light are used.

DETAILED DESCRIPTION

Figure 1A:
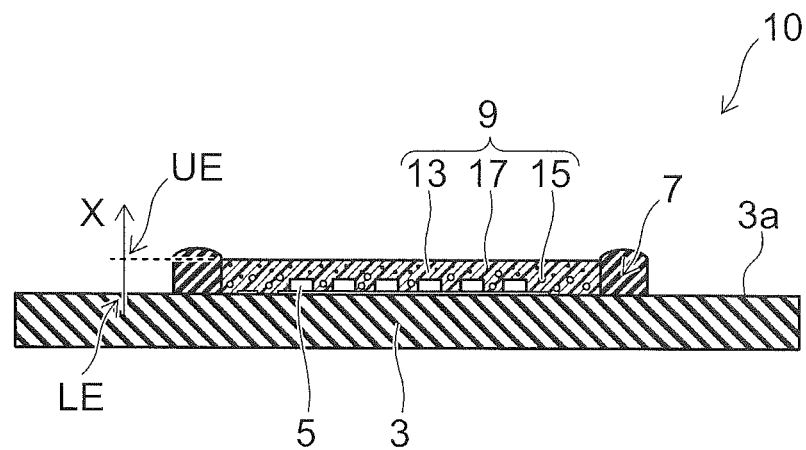
FIGS. 1A and 1B are schematic cross-sectional views illustrating a light emitting module and a lighting device according to an embodiment.

A light emitting module according to one embodiment includes a substrate; a light emitting body disposed on the substrate; and a phosphor layer having a first phosphor and a second phosphor which are excited by emitted light of the light emitting body. The first phosphor has a light emitting peak whose half-value width is 20 nm or less in a wavelength range from 610 nm to less than 650 nm, and the second phosphor has a light emitting peak in the wavelength range between a peak wavelength of a light emitting spectrum of the light emitting body and the peak wavelength of the light emitting spectrum of the first phosphor. Then, a distribution of the first phosphor in the phosphor layer has density gradient, where the density of the first phosphor increases toward at least one end of the phosphor layer in a direction perpendicular to the substrate.

The light emitting spectrum of a CASN or SCASN phosphor used as a red phosphor includes a wavelength band of low relative visibility exceeding 650 nm, and a long wavelength end of an excitation band exceeds 600 nm. That is, there is an aspect of absorbing light in a wavelength region of high relative visibility and emitting the light of the low relative visibility. Therefore, in the light emitting module containing many red phosphors and having a low correlated color temperature, average color rendering index and luminous efficiency are reduced. Accordingly, one embodiment provides a light emitting module and a lighting device which can improve color rendering properties and the luminous efficiency.

Hereinafter, the embodiment will be described with reference to the drawings. The same reference numerals are given to the same elements in the drawing, and detailed description thereof will be appropriately omitted, and different elements will be described. The drawings are schematically and conceptually prepared, and thus, a relationship between a thickness and a width of each element and a ratio of sizes between the elements are not necessarily limited to real things. In addition, even if the same element is represented, in some cases, the element may be represented by mutually different dimensions or ratios depending on the drawing.

Figure 1B:
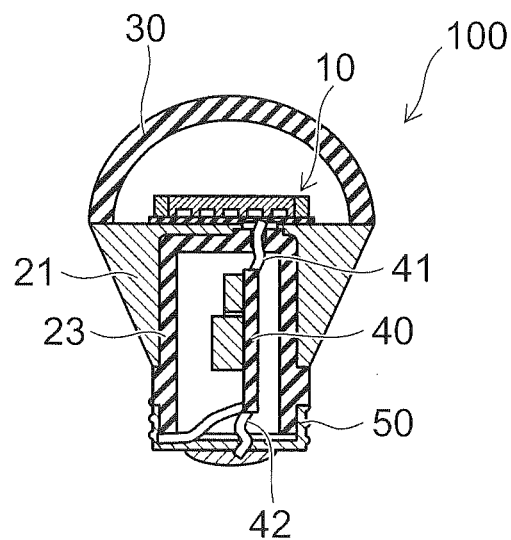

FIGS. 1A and 1B are schematic cross-sectional views illustrating a light emitting module 10 and a lighting device 100 according to the embodiment. FIG. 1A illustrates the light emitting module 10 and FIG. 1B illustrates the lighting device 100 in which the light emitting module is embedded.

As illustrated in FIG. 1A, the light emitting module 10 includes a substrate 3, a light emitting body 5 disposed on the substrate 3, and a phosphor layer 9. The phosphor layer 9 includes a first phosphor and a second phosphor which are excited by emitted light of the light emitting body 5.

The first phosphor is a red phosphor 15 emitting red light. The second phosphor has a light emitting peak in the wavelength band between the peak wavelength of the light emitting spectrum of the light emitting body 5 and the peak wavelength of the light emitting spectrum of the red phosphor 15. Hereinafter, an example will be described using a yellow phosphor 17 emitting yellow light as the second phosphor, but is not limited thereto. For example, as the second phosphor, a green phosphor may be used, and the yellow phosphor and the green phosphor may be mixed together for use.

For example, the substrate 3 is a ceramic substrate. The light emitting body 5 emits the light of 400 to 480 nanometers (nm) in the wavelength, and excites the red phosphor 15 and the yellow phosphor 17. Specifically, the light emitting body 5 is a Light Emitting Diode (LED) and for example, emits blue light of 450 to 460 nm in a dominant wavelength.

For example, the light emitting body 5 is mounted on an upper surface 3a of the substrate 3 via an adhesive. Multiple light emitting bodies 5 are mounted on the substrate 3, and are connected to each other in series or in parallel using a metal wire. Then, a bank 7 is disposed so as to surround the periphery of a region on which the multiple light emitting bodies 5 are mounted. For example, the bank 7 includes a white resin.

Further, a translucent resin 13 in which the red phosphor 15 and the yellow phosphor 17 are dispersed together is poured and cured inside the bank 7. In this manner, the phosphor layer 9 covering the light emitting body 5 is disposed. For example, the red phosphor 15 includes a phosphor represented by a chemical formula of $K_2SiF_6:Mn$, and for example, the yellow phosphor 17 is a YAG phosphor.

For example, the light emitting module 10 is embedded in the lighting device 100 as a light source. As illustrated in FIG. 1B, for example, the lighting device 100 is an electric bulb type lamp, and includes the light emitting module 10, a housing 21 on which the light emitting module 10 is mounted, and a cover 30 covering the light emitting module 10. The lighting device 100 illustrated herein is one example, and thus, the embodiment is not limited thereto.

A power conversion unit 40 supplying power to the light emitting module 10 is disposed inside the housing 21. The power conversion unit 40 is electrically connected to the light emitting module 10 and a socket 50 via lead wires 41 and 42. In addition, the power conversion unit 40 is accommodated in an insulating case 23 disposed inside the housing 21. The power conversion unit 40 receives AC power supply from a commercial power supply (not illustrated) via the socket 50, and for example, supplies the power to the light emitting module 10 by converting the AC power into DC power.

The light emitting module 10 emits white light by receiving the power supply from the power conversion unit 40. That is, the white light is emitted by mixing the blue light emitted from the light emitting body 5, the red light emitted from the red phosphor 15 and the yellow light emitted from the yellow phosphor 17.

Next, referring to FIGS. 2A to 4, characteristics of the light emitting module 10 will be described. FIGS. 2A to 4 are graphs illustrating the characteristics of the red phosphor 15 included in the phosphor layer 9.

Figure 2A:
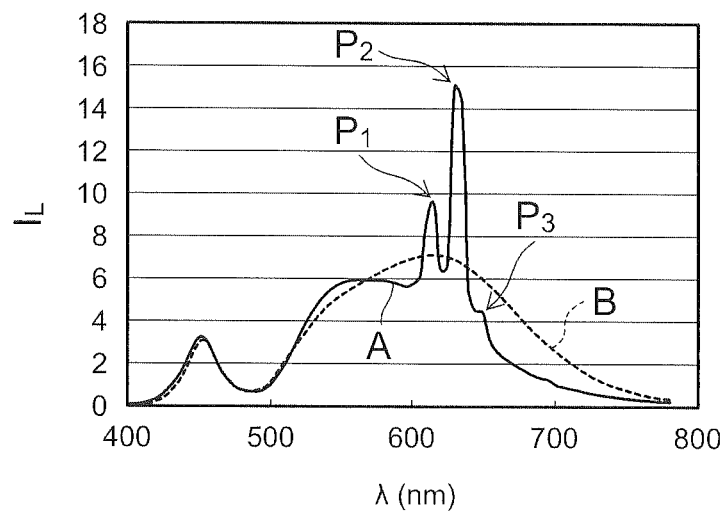
FIGS. 2A and 2B are graphs illustrating characteristics of a phosphor according to the embodiment.

FIG. 2A is a graph illustrating a light emitting spectrum of a phosphor. A horizontal axis represents a light emitting wavelength λ, and a vertical axis represents a light emitting intensity $I_L$. A graph A in FIG. 2A illustrates the light emitting spectrum of the red phosphor 15, and a graph B illustrates the light emitting spectrum of a CASN phosphor according to a comparative example.

As illustrated in the graph A, the red phosphor 15 has light emitting peaks $P_1$, $P_2$ and $P_3$ whose half-value width is 20 nm or less in the wavelength range from 610 nm to less than 650 nm. In addition, the light emitting intensity $I_L$ in the wavelength region of 650 nm or more is equal to or less than half of the light emitting peaks $P_1$ and $P_2$. In contrast, as illustrated in graph B, the CASN phosphor has the light emitting peaks in the wavelength range from 610 to 620 nm, and the half-value width reaches approximately 170 nm. Then, the light emitting intensity in the wavelength of 650 nm is approximately 80% of the light emitting intensity in the peak wavelength.

In the red phosphor 15 according to the present embodiment, the intensity of the light emitting spectrum in the wavelength band of 650 nm or more where relative visibility is reduced is lower than that of the CASN phosphor. Therefore, if the correlated color temperature and the average color rendering index are the same as each other, luminous flux of the light emitting module using the red phosphor 15 is larger than that of one using the CASN phosphor. That is, the luminous efficiency is high.

Figure 2B:
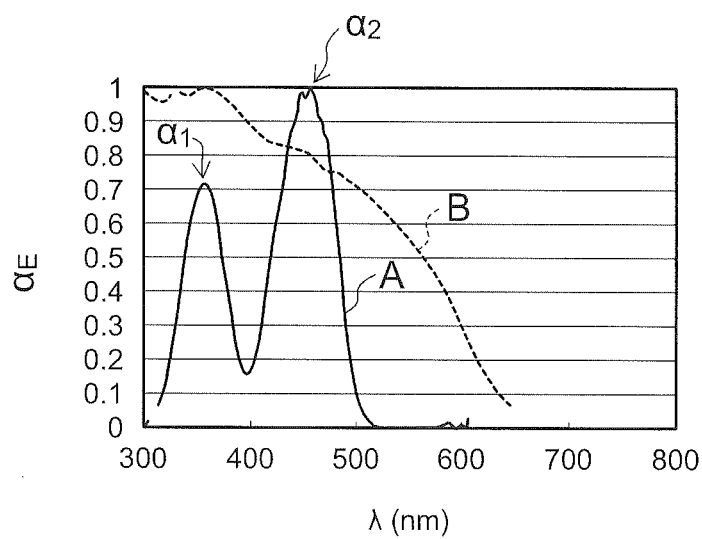

FIG. 2B is a graph illustrating an excitation spectrum of a phosphor. The horizontal axis represents an excited-light wavelength λ, and the vertical axis represents a relative light emitting intensity $\alpha_E$. The graph A in FIG. 2B illustrates the excitation spectrum of the red phosphor 15, and the graph B illustrates the excitation spectrum of a CASN phosphor according to a comparative example.

As illustrated in the graph A, the red phosphor 15 has an excitation band in the wavelength range from 300 nm to 550 nm, and has absorption peaks $\alpha_1$ and $\alpha_2$ of excited light in the vicinity of the wavelength of 350 nm and 450 nm. In contrast, as illustrated in the graph B, for example, the CASN phosphor has a spectrum gradually decreasing from the wavelength of 300 nm toward a longer wavelength side, and has the excitation band in the wavelength range exceeding 600 nm from a wavelength side shorter than 300 nm.

Here, the excitation band represents a wavelength range where the phosphor absorbs energy of the excited light and emits the light.

The absorption peak $\alpha_2$ of the red phosphor 15 is overlapped with the peak wavelength of the light emitting spectrum of a blue LED. Then, the excitation band of the red phosphor 15 in the wavelength range of 500 nm or more is equal to or less than 10% of the absorption peak $\alpha_2$. That is, in the red phosphor 15, a long wavelength end of the excitation band is located in the vicinity of 500 nm. Accordingly, the red phosphor 15 efficiently absorbs the emitted light of the blue LED, but scarcely absorbs the emitted light of the yellow phosphor 17.

In contrast, the excitation band of the CASN phosphor is spread toward the longer wavelength side up to the wavelength exceeding 600 nm. Then, the CASN phosphor absorbs the emitted light of the yellow phosphor 17 and converts the light into the red light. That is, in the light emitting module using the CASN phosphor, output light thereof includes components to be absorbed by both of the yellow phosphor 17 and the CASN phosphor. For this reason, the luminous efficiency of the light emitting module is reduced.

Thus, it is desirable that the long wavelength end of the excitation band of the first phosphor be located at the wavelength side shorter than the peak wavelength of the light emitting spectrum of the second phosphor. The excitation band of $K_2SiF_6$:Mn included in the red phosphor 15 according to the embodiment is located at the wavelength side shorter than 520 nm, and the emitted light of the yellow phosphor 17 and the green phosphor is scarcely absorbed. Therefore, it is possible to increase the luminous efficiency of the light emitting module 10 by using $K_2SiF_6$:Mn.

For example, if compared by using the light emitting module of the average color rendering index of Ra 80 and the correlated color temperature of 2800 Kelvin (K), the luminous efficiency when using the CASN phosphor is 83 lumens (lm)/watt (W). In contrast, the luminous efficiency when using the red phosphor 15 including $K_2SiF_6$:Mn is 100 lm/W. In addition, when the same luminous efficiency is set, whereas the average color rendering index of the light emitting module using the CASN phosphor is 80, the average color rendering index of the light emitting module using the red phosphor 15 is 90. That is, in the light emitting module using the red phosphor 15 including $K_2SiF_6$:Mn, it is possible to increase at least any one of the luminous efficiency and the average color rendering index Ra.

Figure 3A:
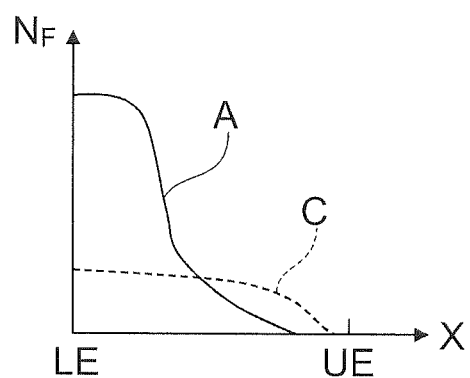
FIGS. 3A and 3B are schematic diagrams illustrating distribution of a phosphor according to the embodiment.
Figure 3B:
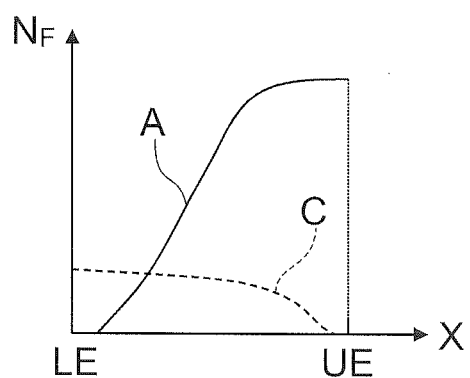

FIGS. 3A and 3B are schematic views illustrating density distribution of a phosphor in a direction perpendicular to the substrate 3 of the phosphor layer 9 (X direction illustrated in FIG. 1A). A graph A illustrates the density distribution of the red phosphor 15, and a graph C illustrates the density distribution of the yellow phosphor 17. FIG. 3A illustrates a case where an average particle diameter of the red phosphor 15 is larger than the average particle diameter of the yellow phosphor 17. FIG. 3B illustrates a case where the average particle diameter of the red phosphor 15 is the same as or smaller than an average particle diameter of the yellow phosphor 17.

As the translucent resin 13 which is a main component of the phosphor layer 9, for example, a thermosetting resin such as silicone is used. Then, viscosity of the translucent resin 13 during a curing process thereof is decreased by heating. Therefore, the red phosphor 15 and the yellow phosphor 17 which are dispersed in the translucent resin 13 are redistributed depending on particle diameters. For example, the phosphor having a large particle diameter is precipitated in the direction of the substrate 3, and the precipitation rate is faster as the particle diameter becomes larger.

Therefore, as illustrated in the graph A of FIG. 3A, when the average particle diameter of the red phosphor 15 is larger than that of the yellow phosphor 17, the red phosphor 15 is more precipitated on the substrate 3 side. Accordingly, a density $N_F$ of the red phosphor 15 is a high density in a lower end LE side (substrate 3 side) of the distribution. Then, the distribution has a density gradient where the density $N_F$ is decreased in the direction of an upper end UE.

For example, it is preferable that the average particle diameter of the red phosphor 15 be equal to or more than 1.6 times the average particle diameter of the yellow phosphor 17. In this manner, it is possible to improve an absorption rate of the excited light by increasing the density of the red phosphor 15 of the substrate 3 side (light emitting body 5 side). As a result, as compared to a case where the red phosphors 15 are uniformly distributed on the phosphor layer 9, it is possible to reduce the content (weight percent: wt %). In addition, if the average particle diameter of the phosphor is large, the absorption rate of the excited light is high. From this point of view, it is possible to reduce the amount of the red phosphor 15 to be included in the phosphor layer 9. That is, it is possible to achieve cost reduction by reducing the amount of the red phosphor 15 to be used.

In contrast, when the average particle diameter of the red phosphor 15 is the same as or smaller than that of the yellow phosphor 17, precipitation of the red phosphor 15 is suppressed. For example, specific gravity of $K_2SiF_6$:Mn is less weighed than the specific gravity of the YAG phosphor. Therefore, as illustrated in FIG. 3B, the red phosphor 15 has the high density in the upper end UE side of the density distribution. Then, the distribution has the density gradient where the density $N_F$ is increased from the lower end LE in the direction of the upper end UE.

In this manner, the density of the red phosphor 15 may be increased in the upper end UE side of the distribution (upper end side of the phosphor layer 9). Accordingly, it is possible to reduce the content of the red phosphor 15 of the phosphor layer 9 by increasing the absorption rate of the excited light as compared to the case of uniformly distributing the red phosphor 15 on the phosphor layer 9. In addition, it is possible to reduce influence of temperature rising of the light emitting body 5 by distributing the red phosphor 15 on the upper end side of the phosphor layer 9 so as to be separated from the light emitting body 5.

As described above, in the density distribution in a direction perpendicular to the substrate 3 of the red phosphor 15, it is preferable to have the density gradient of increasing the density toward at least any one of the upper end UE and the lower end LE. In this manner, it is possible to reduce manufacturing costs by suppressing the amount of the red phosphor 15 to be used.

Further, it is possible to reduce the amount to be used by increasing the average particle diameter of the red phosphor 15. For example, in the light emitting module including the blue LED as the light emitting body 5, when the correlated color temperature is set to 2,800 K, if the average particle diameter of the yellow phosphor 17 is set to 10 lm and the average particle diameter of the red phosphor 15 is set to 16 lm, the content (weight percent: wt %) of the red phosphor 15 is approximately 5 times the content of the yellow phosphor 17. In contrast, if the average particle diameter of the red phosphor 15 is set to 45 lm, the content thereof is reduced to 3.8 times the content of the yellow phosphor 17.

In addition, it is possible to reduce the amount of the yellow phosphor 17 to be used by using the red phosphor 15 according to the present embodiment. For example, the CASN phosphor absorbs the emitted light of the yellow phosphor 17, since the excitation spectrum is spread up to the wavelength of 650 nm. Therefore, in order to achieve a desired correlated color temperature, it is necessary to increase the yellow phosphor 17 by the amount to compensate for the absorption of the CASN phosphor.

On the other hand, in $K_2SiF_6$:Mn included in the red phosphor 15 according to the present embodiment, the long wavelength end of the excitation spectrum is 520 nm. Therefore, the emitted light of the yellow phosphor 17 need not be absorbed and thus it is not necessary to compensate for the absorption. Therefore, it is possible to reduce the content of the yellow phosphor 17. For example, in the light emitting module where the correlated color temperature is 3,000 K or less, the content (wt %) of the red phosphor 15 is equal to or more than 3 times the content (wt %) of the yellow phosphor 17. For example, in the light emitting module where the correlated color temperature is 2,800 K, when the average particle diameter of the red phosphor 15 is set to 20 to 30 μm, the content thereof is 6 to 7 times the content of the yellow phosphor 17 (YAG phosphor).

Figure 4:
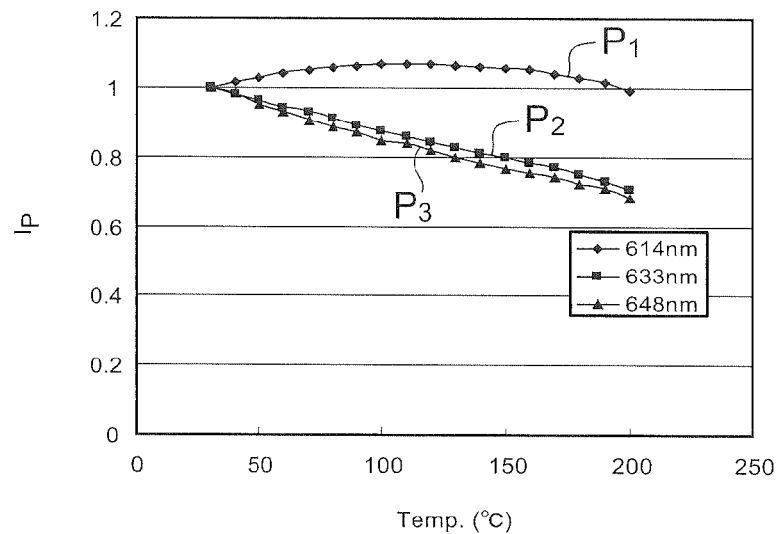
FIG. 4 is a graph illustrating temperature characteristics of a phosphor according to the embodiment.

FIG. 4 is a graph illustrating temperature characteristics of the red phosphor 15 according to the embodiment. The horizontal axis represents a temperature of the light emitting module 10 and the vertical axis represents relative intensity $I_P$ of the light emitting peak of the red phosphor 15.

The red phosphor 15 has multiple light emitting peaks $P_1$, $P_2$ and $P_3$ in the wavelength range from 610 nm to less than 650 nm (refer to FIG. 2A). These light emitting peaks respectively have the peak wavelength of 615 nm, 633 nm and 618 nm, corresponding to the light emitting peak of $K_2SiF_6$:Mn. Then, the half-value widths are respectively 20 nm or less.

FIG. 4 illustrates a temperature change of the light emitting intensity in each light emitting peak, based on the light emitting intensity of 25° C. As illustrated in FIG. 4, the light emitting intensity of the light emitting peak $P_1$ of the wavelength of 615 nm is not decreased in a temperature range from 25° C. to 200° C., but is rather increased from 25° C. to 100° C. On the other hand, the light emitting intensity of the light emitting peaks $P_2$ and $P_3$ in the peak wavelength of 633 nm and 648 nm is monotonically decreased along with the temperature rising, and is decreased to approximately 70% of 25° C. at 200° C.

Human relative visibility reaches a peak in the wavelength of 555 nm, and is decreased as the wavelength is longer. Therefore, in the red phosphor 15, the light emitting intensity of the light emitting peak $P_1$ in the peak wavelength of 615 nm where the relative visibility is high is not decreased in contrast to the temperature rising of the module. On the other hand, in the light emitting peaks $P_2$ and $P_3$ where the temperature change of the light emitting intensity is considerable, the visibility is low. Therefore, when considering the relative visibility, the temperature change of the light emitting intensity of the red phosphor 15 is suppressed.

In addition, the red phosphor 15 has a large stroke loss, and the temperature thereof is likely to rise. Therefore, if decrease in the light emitting intensity due to the temperature rising in the wavelength region where the relative visibility is high can be suppressed, it is possible to improve the temperature characteristics of the light emitting module 10. For example, in the light emitting module 10 using the red phosphor 15, it is possible to suppress temperature quenching in an operation for a large quantity of light.

Figure 5:
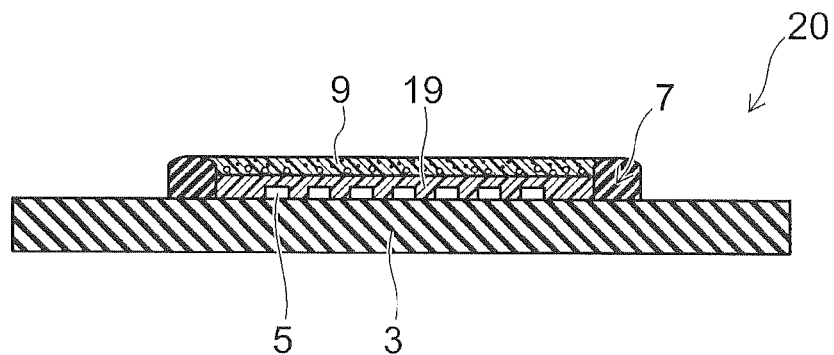
FIG. 5 is a schematic cross-sectional view illustrating a light emitting module according to a modification example of the embodiment.

FIG. 5 is a schematic cross-sectional view of a light emitting module 20 according to a modification example of the embodiment. As illustrated in FIG. 5, the light emitting module 20 includes the substrate 3, the light emitting body 5 disposed on the substrate 3, and the phosphor layer 9. Then, an intermediate layer 19 covering the light emitting body 5 is further provided on the substrate 3. The phosphor layer 9 is disposed on the intermediate layer 19. The intermediate layer 19 allows the emitted light of the light emitting body 5 to be transmitted. Here, the term "transmission" is not limited to the transmission of all the emitted light of the light emitting body 5, but includes a case of absorbing a portion thereof.

For example, the intermediate layer 19 is a translucent resin such as silicone, and includes translucent inorganic oxide or glass. In addition, the intermediate layer 19 contains, for example, 20 wt % or more of the translucent inorganic oxide or the glass.

For example, in the light emitting module 10 illustrated in FIG. 1A, the light emitting body 5 is directly covered with the phosphor layer 9. Accordingly, the light emitting of the red phosphor 15 and the yellow phosphor 17 in the phosphor layer 9 is influenced by the temperature rising of the light emitting body 5. In contrast, in the light emitting module 20, the intermediate layer 19 isolates the phosphor layer 9 from the light emitting body 5. In this manner, it is possible to suppress, for example, the decrease in the luminous efficiency of each phosphor or the rising of the correlated color temperature by reducing the influence of the temperature rising of the light emitting body 5.

As described above, the light emitting module according to the present embodiments adopts the red phosphor 15 which does not emit the light in the wavelength region of 650 nm or more where the relative visibility is low and further does not absorb the emitted light in a visible light region where the visibility is high. In this manner, color rendering properties are improved, thereby enabling the high luminous efficiency to be obtained in the module of the low correlated color temperature. In addition, in the phosphor layer 9, the density distribution of the red phosphor 15 is controlled so that the density is increased on at least any one side of the upper end and the lower end thereof. In this manner, it is possible to achieve the cost reduction of the light emitting module by reducing the content of the red phosphor 15.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A light emitting module comprising:
a substrate;
a light emitting body disposed on the substrate; and
a phosphor layer having a first phosphor and a second phosphor which are excited by emitted light of the light emitting body, the first phosphor having a light emitting peak whose half-value width is 20 nm or less in a wavelength range from 610 nm to less than 650 nm, the second phosphor having the light emitting peak in the wavelength range between a peak wavelength of a light emitting spectrum of the light emitting body and the peak wavelength of the light emitting spectrum of the first phosphor, and a distribution of the first phosphor in the phosphor layer having density gradient, where the density of the first phosphor increases toward at least one end of the phosphor layer in a direction perpendicular to the substrate.

2. The module according to claim 1,
wherein an average particle diameter of the first phosphor is larger than an average particle diameter of the second phosphor, and
the first phosphor is disposed so that the density of the first phosphor increases toward the substrate.

3. The module according to claim 2,
wherein the average particle diameter of the first phosphor is 1.6 or more times the average particle diameter of the second phosphor.

4. The module according to claim 1,
wherein the average particle diameter of the first phosphor is the same as or smaller than the average particle diameter of the second phosphor, and
the first phosphor is disposed so that the density of the first phosphor increases as increasing separation from the substrate.

5. The module according to claim 1,
wherein light emitting intensity in a wavelength region of 650 nm or more of the first phosphor is equal to or less than half of intensity of the light emitting peak.

6. The module according to claim 1,
wherein the first phosphor has multiple light emitting peaks in the wavelength range from 610 nm to less than 650 nm, and
a temperature change of light emitting intensity in the light emitting peak located in a shorter wavelength side among the multiple light emitting peaks is smaller than the temperature change of the light emitting intensity in the light emitting peak located in a longer wavelength side.

7. The module according to claim 1,
wherein the first phosphor has an excitation band in the wavelength range from 300 nm to 550 nm, and has an absorption peak of excitation light in a wavelength range between 350 nm and 450 nm.

8. The module according to claim 7,
wherein intensity of the excitation band of the first phosphor in the wavelength range of 500 nm or more is equal to or less than 10% of the intensity of the absorption peak.

9. The module according to claim 1,
wherein content of the first phosphor is equal to or more than three times content of the second phosphor.

10. The module according to claim 9,
wherein the content of the first phosphor is from 3.8 times to 5 times the content of the second phosphor.

11. The module according to claim 1,
wherein the first phosphor includes a phosphor represented by a chemical formula of $K_2SiF_6$:Mn.

12. The module according to claim 1,
wherein the light emitting body emits light in a wavelength range from 400 nm to 480 nm.

13. The module according to claim 1, further comprising:
an intermediate layer covering the light emitting body on the substrate and allowing the emitted light of the light emitting body to be transmitted,
wherein the phosphor layer is disposed on the intermediate layer.

14. The module according to claim 13,
wherein the intermediate layer includes at least one of translucent inorganic oxide and glass.

15. A lighting device comprising:
a light emitting module including a substrate; a light emitting body disposed on the substrate; and a phosphor layer having a first phosphor and a second phosphor which are excited by emitted light of the light emitting body, the first phosphor having a light emitting peak whose half-value width is 20 nm or less in a wavelength range from 610 nm to less than 650 nm, the second phosphor having the light emitting peak in the wavelength range between a peak wavelength of a light emitting spectrum of the light emitting body and the peak wavelength of the light emitting spectrum of the first phosphor, and a distribution of the first phosphor in the phosphor layer having density gradient, where the density of the first phosphor increases toward at least one end of the phosphor layer in a direction perpendicular to the substrate; and a housing on which the light emitting module is mounted.

* * * * *